(12) United States Patent
Jang et al.

(10) Patent No.: US 9,578,792 B2
(45) Date of Patent: Feb. 21, 2017

(54) MAGNETIC SHIELDING SHEET FOR DIGITIZER AND PORTABLE TERMINAL HAVING SAME

(71) Applicant: AMOSENSE CO., LTD., Cheonan-si (KR)

(72) Inventors: Kil Jae Jang, Seongnam-si (KR); Dong Hoon Lee, Yongin-si (KR); Ki Chul Kim, Incheon (KR)

(73) Assignee: AMOSENSE CO., LTD. (KR)

( * ) Notice: Subject to any disclaimer, the term of this patent is extended or adjusted under 35 U.S.C. 154(b) by 0 days.

(21) Appl. No.: 14/891,797

(22) PCT Filed: May 27, 2014

(86) PCT No.: PCT/KR2014/004705
§ 371 (c)(1),
(2) Date: Nov. 17, 2015

(87) PCT Pub. No.: WO2014/193137
PCT Pub. Date: Dec. 4, 2014

(65) Prior Publication Data
US 2016/0106012 A1    Apr. 14, 2016

(30) Foreign Application Priority Data
May 28, 2013    (KR) .................. 10-2013-0060289

(51) Int. Cl.
*H05K 9/00* (2006.01)
*H04B 1/3888* (2015.01)
(Continued)

(52) U.S. Cl.
CPC .......... *H05K 9/0083* (2013.01); *G06F 1/1643* (2013.01); *G06F 1/203* (2013.01);
(Continued)

(58) Field of Classification Search
CPC .......... Y10T 156/10; Y10T 428/24802; Y10T 428/24851; H05K 9/0081; H05K 9/0086; H05K 9/0088; B32B 2457/00; B32B 7/12; B32B 2307/212; B32B 2307/702; B32B 27/36; B32B 27/06; B32B 7/06; G06F 1/203; G06F 1/1643; H04B 1/3888; H01F 1/15308
See application file for complete search history.

(56) References Cited

U.S. PATENT DOCUMENTS

2002/0074144 A1\* 6/2002 Watanabe ............. H01L 23/552
174/394
2010/0288418 A1\* 11/2010 Yang ................ G06K 19/07771
156/62.2
(Continued)

FOREIGN PATENT DOCUMENTS

KR    1020040035019    4/2004
KR    100460297    12/2004
(Continued)

OTHER PUBLICATIONS

International Search Report—PCT/KR2014/004705 dated Sep. 5, 2014.

*Primary Examiner* — Adrian S Wilson
*Assistant Examiner* — Abhishek Rathod
(74) *Attorney, Agent, or Firm* — Cantor Colburn LLP

(57) ABSTRACT

A magnetic field shielding sheet includes: a magnetic field shielding main sheet disposed on the back of the digitizer to thus prevent affecting the digitizer; and a magnetic field shielding sub-sheet laminated in a dual on at least one of four side edges of the magnetic field shielding main sheet, and to prevent affecting the digitizer by the magnesium frame inside the portable terminal, wherein the magnetic field shielding main sheet includes a shielding layer made of a plurality of pieces, a cover layer adhered to one surface of (Continued)

the shielding layer, and a double-sided tape adhered to the other surface of the shielding layer. A magnetic field arising from various components incorporated in a portable terminal device is shielded by the magnetic field shielding main sheet while the magnetic field shielding sub-sheet prevents a digitizer from being affected by a magnesium frame, thereby enhancing performance of the digitizer.

9 Claims, 3 Drawing Sheets

(51) Int. Cl.
*G06F 1/16* (2006.01)
*G06F 1/20* (2006.01)

(52) U.S. Cl.
CPC ......... *H04B 1/3888* (2013.01); *H05K 9/0086* (2013.01); *H05K 9/0088* (2013.01); *B32B 2307/212* (2013.01)

(56) References Cited

U.S. PATENT DOCUMENTS

| | | | | |
|---|---|---|---|---|
| 2014/0083758 | A1* | 3/2014 | Park | H05K 9/0081 |
| | | | | 174/391 |
| 2014/0362505 | A1* | 12/2014 | Jang | H05K 9/0075 |
| | | | | 361/679.4 |
| 2015/0326054 | A1* | 11/2015 | Park | H02J 7/025 |
| | | | | 455/573 |

FOREIGN PATENT DOCUMENTS

| | | |
|---|---|---|
| KR | 1020120079598 | 7/2012 |
| KR | 1020130002237 | 1/2013 |
| KR | 1020130050633 | 5/2013 |

* cited by examiner

MAGNETIC SHIELDING SHEET FOR DIGITIZER AND PORTABLE TERMINAL HAVING SAME

FIELD OF THE INVENTION

The present invention relates to a magnetic field shielding sheet for a digitizer, which minimizes impact on a geomagnetic sensor, shields a magnetic field arising from various components incorporated in a portable terminal device for implementing a digitizer function in the portable terminal device and improves sensitivity of an electronic stylus, and to a portable terminal device having the same.

BACKGROUND OF THE INVENTION

Recently, portable terminals such as smartphones equipped with a digitizer function have released and become popular. A digitizer using an electronic pen can draw a line of about 0.7 mm thick which is more elaborate than a capacitive touch panel which recognizes a line of 3-4 mm thick. Therefore, the digitizer using an electronic pen can easily perform a fine operation.

The digitizer function is also applied to a large-screen tablet personal computer (PC) or the like that employs a large display, as well as a small portable terminal device such as a smart phone.

In order to employ the digitizer function using electromagnetic induction for a portable terminal, a magnetic field shielding sheet for shielding an electromagnetic field generated from various parts of a portable terminal device body is inserted between a digitizer panel and a main circuit board.

An electromagnetic wave shielding member using a conventional ribbon, as disclosed in Korean Patent Publication No. 10-0460297 (on Nov. 26, 2004), includes: a metal ribbon composed of any one metal or alloy selected from the group consisting of Ni—Fe—Mo, Fe—Si and mu-metal and whose relative magnetic permeability is 1000 or more, in which the thickness of the metal ribbon is between 1 μm and 900 μm, and the width of the metal ribbon is in the range of from 1 mm to 90 mm; and an adhesive layer formed on at least one side of the metal ribbon.

Such a conventional electromagnetic wave shielding member may cause radiation to the opposite side of the metal ribbon which a magnetic field enters, in which the magnetic field passes through and along the plane of the metal ribbon when the magnetic field is applied from outside along the side of the metal ribbon in the case that the metal ribbon is in a flat plate form.

Further, when the electronic pen function is added to a portable terminal device, a digitizer panel is attached to the body of the portable terminal device body. In this case, a magnetic field shielding sheet is provided to avoid affecting the digitizer function by a magnetic field generated by various parts built in the portable terminal device body.

A frame for reinforcing an overall strength of the portable terminal device body and supporting various parts is provided in the portable terminal device. A lightweight and high-intensity magnesium frame is mainly used therefor.

However, in the case of using the magnesium frame, the digitizer is influenced by a magnesium material of the magnesium frame, to thereby cause a problem that the digitizer function is reduced.

SUMMARY OF THE INVENTION

To solve the above problems or defects, it is an object of the present invention to provide a magnetic field shielding sheet that can block a digitizer from being affected by a magnesium frame (or a magnesium bracket), and a portable terminal device having the same.

It is another object of the present invention to provide a magnetic field shielding sheet which improves sensitivity of a digitizer, does not affect a geomagnetic sensor, and shields an electromagnetic field arising from various components incorporated in a portable terminal device body, by performing an overheating process at a critical temperature or higher when heat-treating ribbons of a Fe-based amorphous alloy, to thus reduce permeability of the magnetic field shielding sheet into optimum permeability, and to a portable terminal device having the same.

The technical problems to be solved in the present invention are not limited to the above-mentioned technical problems, and the other technical problems that are not mentioned in the present invention may be apparently understood by one of ordinary skill in the art in the technical field to which the present invention belongs.

To accomplish the above and other objects of the present invention, according to an aspect of the present invention, there is provided a magnetic field shielding sheet for a digitizer, the magnetic field shielding sheet comprising: a magnetic field shielding main sheet that is disposed on a rear surface of the digitizer to thus prevent affecting the digitizer; and a magnetic field shielding sub-sheet that is laminated in a dual on at least one of four side edges of the magnetic field shielding main sheet, and to prevent the digitizer from being affected by a magnesium frame inside a portable terminal device, wherein the magnetic field shielding main sheet is made of an amorphous alloy or a nanocrystalline alloy, and comprises a shielding layer made of a plurality of pieces by flakes, a cover layer adhered to one surface of the shielding layer, and a double-sided tape adhered to the other surface of the shielding layer, and wherein the magnetic field shielding sub-sheet is formed of a band shape having a certain width and is attached to a periphery of the magnetic field shielding main sheet while having the same structure as that of the magnetic field shielding main sheet.

According to another aspect of the present invention, there is provided a portable terminal device comprising: a case; a display panel disposed in front of the case; a digitizer panel disposed on a rear surface of the display panel; a magnetic field shielding sheet disposed on a rear surface of the digitizer panel; a magnesium frame mounted inside the case and to which various parts and panels are fixed, wherein the magnetic field shielding sheet comprises: a magnetic field shielding main sheet that is placed one a rear surface of the digitizer panel and prevents affecting the digitizer panel; and a magnetic field shielding sub-sheet that is attached on at least one of four side edges of the magnetic field shielding main sheet, and to prevent affecting the digitizer by the magnesium frame, wherein the magnetic field shielding main sheet is made of an amorphous alloy or a nanocrystalline alloy, and comprises: a shielding layer made of a plurality of pieces by a flake-treatment process; a cover layer adhered to one surface of the shielding layer; and a double-sided tape adhered to the other surface of the shielding layer, and wherein the magnetic field shielding sub-sheet is formed of a band shape having a certain width and is attached to a periphery of the magnetic field shielding main sheet while having the same structure as that of the magnetic field shielding main sheet.

EFFECTS OF THE INVENTION

As described above, the magnetic field shielding sheet according to the present invention is configured to include a magnetic field shielding sub-sheet that is provided on at least one of four side edges of a magnetic field shielding main sheet that is disposed on a rear surface of a digitizer in which the magnetic field shielding main sheet shields a magnetic field arising from various components incorporated in a portable terminal device while the magnetic field shielding sub-sheet prevents a digitizer from being affected by a magnesium frame (or a magnesium bracket), to thereby enhance performance of the digitizer.

The magnetic field shielding sheet according to the present invention is configured so that magnetic permeability of the magnetic field shielding sheet is reduced into the optimum magnetic permeability by overheating a Fe-based amorphous alloy ribbon at a temperature of a critical temperature or higher when the Fe-based amorphous alloy ribbon is heat-treated, thus improving the sensitivity of a digitizer, having no influence upon a geomagnetic sensor, and shielding an electromagnetic field generated from various components of a main body of a portable terminal device.

DETAILED DESCRIPTION FOR CARRYING OUT THE INVENTION

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
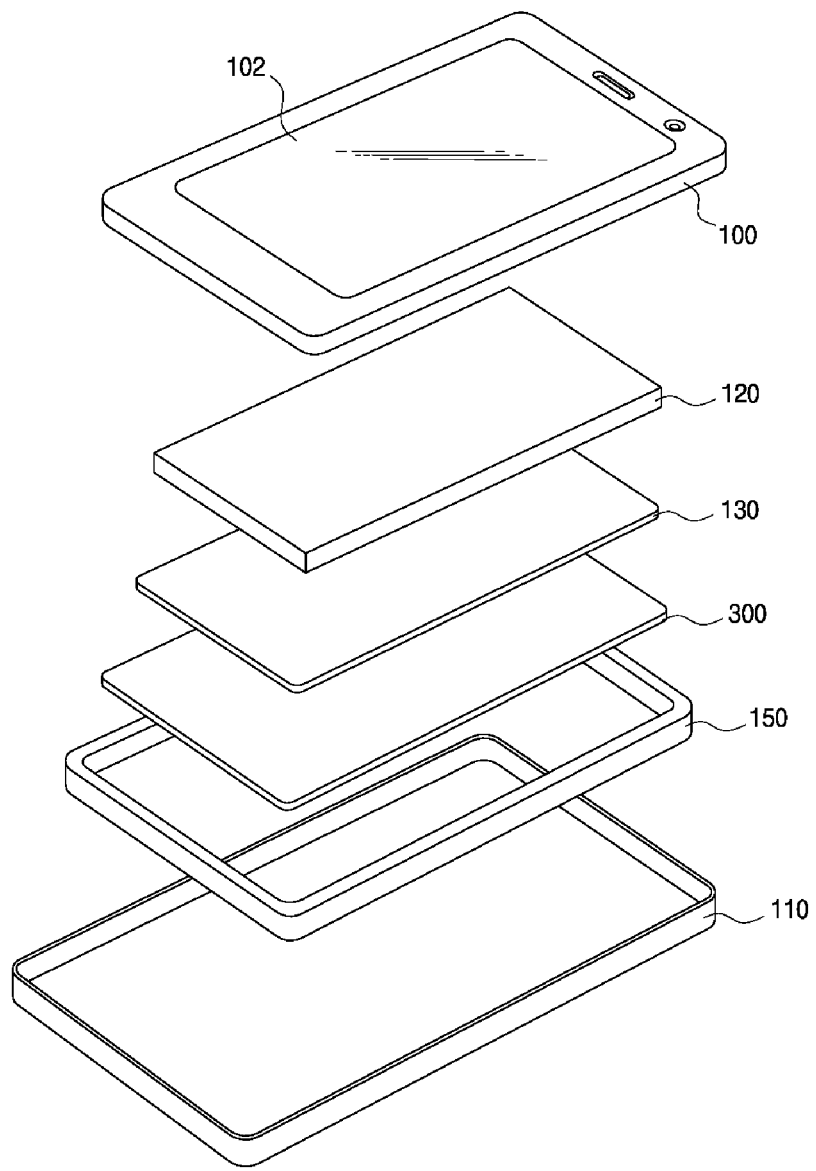
FIG. 1 is an exploded perspective view of a portable terminal device according to an embodiment of the present invention.

FIG. 1 is an exploded perspective view of a portable terminal device according to an embodiment of the present invention.

Referring to FIG. 1, a portable terminal device according to an embodiment of the present invention includes: a case composed of a front case 100 and a rear case 110; a main printed circuit board (PCB) (not shown) that is arranged in the case, in which various circuit parts are mounted in the interior space of the case; a display panel 120 visually displaying information thereon; a digitizer panel 130 to perform an electronic stylus function; a magnetic field shielding sheet 300 that is arranged on a rear surface of the digitizer panel 130 to shield a magnetic field generated from various components mounted in the case and to prevent the digitizer panel from being affected by the magnetic field; and a frame (or bracket) 150 to secure the various components mounted in the case and to reinforce strength of the case.

The case includes the front case 100 that is provided with a transparent window 102, and the rear case 110 coupled with the front case 100 and playing a battery cover role.

The display panel 120 may be provided with a touch screen for inputting information by a user's touch.

Such a portable terminal device has a lightweight, and a strong strength, because it is portable. To this end, the frame 150 is a magnesium frame that is light and highly intense.

Figure 2:
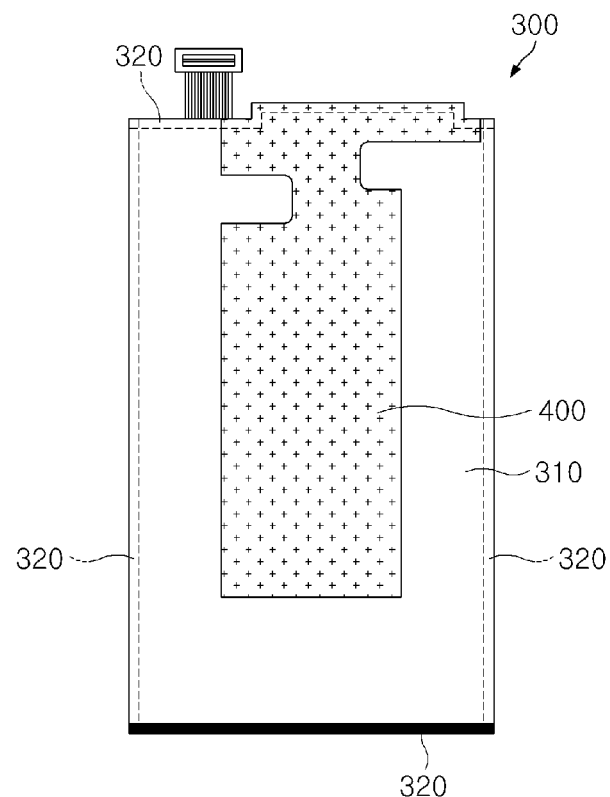
FIG. 2 is a plan view of a magnetic field shielding sheet according to an embodiment of the present invention.

As shown in FIGS. 1 and 2, the magnetic field shielding sheet 300 includes: a magnetic field shielding main sheet 310 that is disposed on the back of the digitizer panel 130 to thus prevent the digitizer panel 130 from being affected by a magnetic field generated from various components mounted in the portable terminal device; and a magnetic field shielding sub-sheet 320 that is attached on at least one of four side edges of the magnetic field shielding main sheet 310, and to prevent affecting the digitizer panel 130 by the magnesium frame 150.

When the digitizer panel 130 is secured to the magnesium frame 150, at least one side of the digitizer panel 130 becomes in close contact with the magnesium frame 150 and is secured with a screw, and the magnetic field shielding sub-sheet 320 is preferably attached to one side of the magnesium frame 150 to which the digitizer panel 130 is fixed.

A heat dissipation sheet 400 is attached on the magnetic field shielding main sheet 310, to dissipate heat generated from components incorporated in the portable terminal device.

The magnesium frame has a lightweight and a strong strength and thus is mainly used as a frame of a portable terminal device. However, since a main material of the magnesium frame is magnesium, the digitizer is affected, to thereby cause a problem of lowering digitizer performance.

In this embodiment, the magnetic field shielding sub-sheet 320 is attached to the at least one of the four side edges of the magnetic field shielding main sheet 310 to prevent the digitizer from being influenced by the magnesium frame.

Here, the magnetic field shielding sub-sheet 320 is formed of a band shape having a certain width and is attached to a periphery of the magnetic field shielding main sheet 310 while having the same structure as that of the magnetic field shielding main sheet 310.

Figure 3:
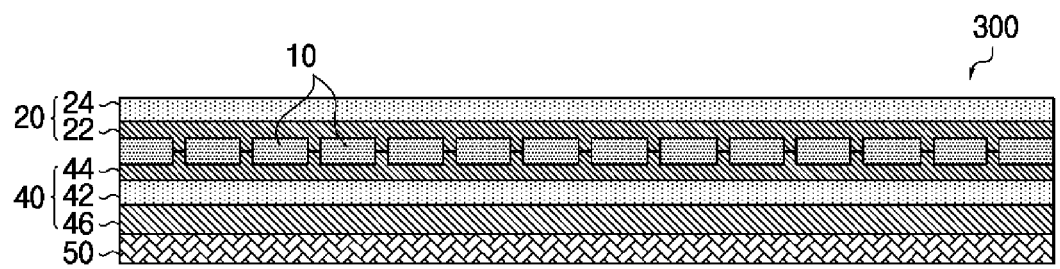
FIG. 3 is a cross-sectional view of a magnetic field shielding sheet according to an embodiment of the present invention.
Figure 4:
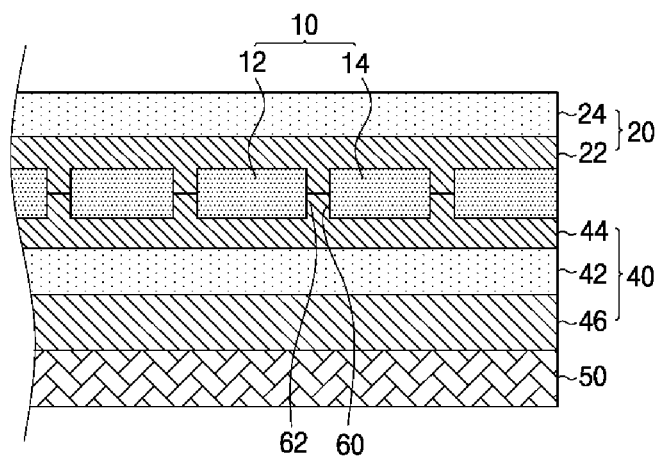
FIG. 4 is a partially enlarged cross-sectional view of the magnetic field shielding sheet according to an embodiment of the present invention.

FIG. 3 is a cross-sectional view of a magnetic field shielding sheet according to an embodiment of the present invention, and FIG. 4 is a partially enlarged cross-sectional view of the magnetic field shielding sheet according to an embodiment of the present invention.

The magnetic field shielding sheet 300 includes a shielding layer 10, a cover layer 20 adhered to one surface of the shielding layer 10, and a double-sided tape 40 adhered to the other surface of the shielding layer 10.

In addition, when the shielding layer 10 is of a multi-layer structure, adhesive layers are provided between a plurality of shielding layers, for adhesion between the shielding layers. Here, the adhesive layers may be double-sided tapes.

The shielding layer 10 may be implemented by using any one of a Fe-based amorphous alloy, a Co-based amorphous alloy, and a nanocrystalline alloy.

For example, the Fe-based amorphous alloy may be a Fe—Si—B alloy, and it is preferable that Fe should be in a range of 70-90 atomic %, and the sum of Si and B should be in a range of 10-30 atomic %. The higher the content of a metal including Fe, the higher a saturation magnetic flux density becomes, but if the content of Fe is excessive, it is difficult to form an amorphous state. Thus, in the present invention, it is preferable that the content of Fe should be in a range of 70-90 atomic %. In addition, an amorphous state forming ability of the alloy is the most excellent when the range of the sum of Si and B is in a range of 10-30 atomic %. In order to prevent corrosion, a corrosion-resistant element such as Cr or Co may be also added to the basic composition within 20 atomic %, and a small amount of other metal elements necessary to impart other properties may be included in the basic composition.

For example, the Fe—Si—B alloy whose crystallization temperature is 508° C. and whose Curie temperature (Tc) is 399° C. can be used in the present invention. However, the crystallization temperature may be varied depending on the content of Si and B, or the other metal elements and the content thereof to be added in addition to a ternary alloy composition.

In the present invention, a Fe—Si—B—Co-based alloy can be used as the Fe-based amorphous ribbon, as needed. Meanwhile, thin-plate ribbons made of Fe-based amorphous ribbons may be used as the shielding layer 10.

The shielding layer 10 may have a thickness of 15 μm to 35 μm. In this case, in consideration of a handling process after the heat treatment of the shielding layer 10, a thickness of the shielding layer 10 is preferably set to be in a range of 25 μm to 30 μm. The thinner the thickness of the shielding layer 10 may become, a breakage phenomenon of the shielding layer 10 may occur due to even a little shock at the time of performing a handling process after the heat treatment.

Then, the shielding layer 10 is flake-processed to be formed into a plurality of flake pieces 12 and 14, in which the plurality of flake pieces 12 and 14 are preferably formed to be in a range of several tens μm to 3 mm.

The cover layer 20 includes: a first adhesive layer 22 which is attached on a surface of the shielding layer 10; and a cover film 24 which is formed on the first adhesive layer 22 and for protecting the shielding layer 10.

The cover film 24 may be preferably formed of a PET (Polyethylene Terephthalate) film and any material whose thickness is thin and which can protect the shielding layer 10 can be used as the cover film 24 beside the PET film.

In addition, a thermoplastic adhesive which may be deformed when being pressed while heating may be used as the first adhesive layer 22. Otherwise, any adhesive which may be deformed when being pressed at the room temperature may be also used as the first adhesive layer 22.

In addition, since the first adhesive layer 22 maintains an adhesive strength in order to bond the cover film 24 on one surface of the shielding layer 10, and a portion of the adhesive of the first adhesive layer 22 should be filled in gaps 60 between the plurality of flake pieces 12 and 14, the thickness of the first adhesive layer 22 is preferably formed in a thickness of at least 50% compared to that of the shielding layer 10.

As an example, the thickness of the cover film 24 and the thickness of the first adhesive layer 22 may be in a range of 10~100 μm, preferably having a thickness of 30 μm.

The double-sided tape 40 includes: a substrate 42; a second adhesive layer 44 formed on one surface of the substrate 42 and bonded on the other surface of the shielding layer 10; and a third adhesive layer 46 formed on the other surface of the substrate 42 and bonding a magnetic field shielding sheet on a component to achieve electromagnetic field shielding.

In addition, a release film 50 is attached on the third adhesive layer 46 to protect the third adhesive layer 46 in which the release film 50 is peeled off when a magnetic field shielding sheet is attached on the third adhesive layer 46.

A PET (Polyethylene Terephthalate) film may be used as the substrate 42 so as to support a double-sided tape to have a sufficient strength, and a thermoplastic adhesive which may be deformed when being pressed while heating at a temperature of the room temperature or higher or an adhesive which may be deformed when being pressed at the room temperature can be used as the second adhesive layer 44 and the third adhesive layer 46 similarly to the first adhesive layer 24.

Here, the thickness of the double-sided tape 40 may be used in a range of 10 μm~100 μm, preferably having a thickness of 30 μm.

When the second adhesive layer 44 is pressed at the room temperature or at a heat-applied temperature, a portion of the second adhesive layer 44 is filled in the gaps 60 between the plurality of flake pieces 12 and 14 to thus form adhesive films 62.

Thus, since the second adhesive layer 44 maintains an adhesive strength in order to bond the double-sided tape 40 on the other surface of the shielding layer 10, and a portion of the adhesive of the second adhesive layer 44 should be filled in the gaps 60 between the plurality of flake pieces 12 and 14, the thickness of the second adhesive layer 44 is preferably formed in a thickness of at least 50% compared to that of the shielding layer 10.

The adhesive film 62 has a structure capable of preventing water from penetrating into the gaps 60 since a portion of the first adhesive layer 22 flows into the gaps 60 and that of the second adhesive layer 44 also flows into the gaps 60, when both sides of the magnetic field shielding sheet are pressed at the room temperature or at a heat-applied temperature.

In this way, the adhesive films 62 may block water from flowing into the gaps fundamentally since the adhesive film 62 may fill the gaps 60 between the flake pieces 12 and 14. Accordingly, since it is possible to prevent oxidation of the shielding layer 10, it is possible to prevent the appearance of the shielding layer 10 from being deformed or prevent some performance of the shielding layer 10 from lowering.

In addition, a separate process and a separate adhesive may be unnecessary to fill the gaps 60 between the pieces 12 and 14, to thus save the manufacturing process and cost. That is, when both sides of the magnetic field shielding sheet are pressed at the room temperature or at a heat-applied temperature after the magnetic field shielding sheet has been prepared, a portion of the first adhesive layer 22 which serves to adhere the cover film 24 to one surface of the of the shielding layer 10 10 flows into the gaps 60, and a portion of the second adhesive layer 44 of the double-sided tape 40 which serves to attach the magnetic field shielding sheet on another component flows into the gaps 60, to thereby form the adhesive films 62. Accordingly, a separate adhesive and process is unnecessary to form the adhesive films.

Figure 5:
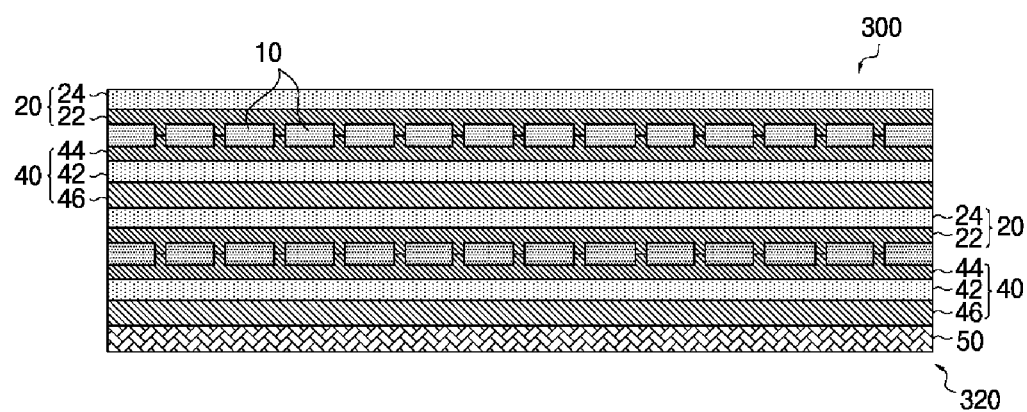
FIG. 5 is a cross-sectional view of a magnetic field shielding main sheet on which a magnetic field shielding sub-sheet is laminated according to an embodiment of the present invention.

FIG. 5 is a cross-sectional view of a magnetic field shielding main sheet on which a magnetic field shielding sub-sheet is laminated according to an embodiment of the present invention.

As shown in FIG. 5, the magnetic field shielding sub-sheet 320 has the same structure as that of the magnetic field shielding main sheet 310 described above, and is attached on an upper surface of the magnetic field shielding main sheet 310. That is, the magnetic field shielding sheet 300 has a structure in which the magnetic field shielding sheets are laminated doubly by attaching a double-sided tape to an edge of the magnetic field shielding main sheet 310 after removal of a release film 50 and attaching the magnetic field shielding sub-sheet 320 on an upper surface of the magnetic field shielding main sheet 310.

Thus, the magnetic field shielding sheet 300 according to the present embodiment configured to include a magnetic field shielding sub-sheet 320 that is provided on a magnetic field shielding main sheet 310 in which the magnetic field shielding main sheet 310 shields a magnetic field arising from various components incorporated in a portable terminal device while the magnetic field shielding sub-sheet 320 prevents a digitizer from being affected by a magnesium frame 150, to thereby enhance performance of the digitizer.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

The invention claimed is:

1. A magnetic field shielding sheet for a digitizer, the magnetic field shielding sheet comprising:
   a magnetic field shielding main sheet that is disposed on a rear surface of the digitizer to thus prevent affecting the digitizer; and
   a magnetic field shielding sub-sheet that is laminated in a dual on at least one of four side edges of the magnetic field shielding main sheet, to prevent the digitizer from being affected by a magnesium frame inside a portable terminal device,
   wherein the magnetic field shielding main sheet is made of an amorphous alloy or a nanocrystalline alloy, and comprises a shielding layer made of a plurality of pieces by flakes, a cover layer adhered to one surface of the shielding layer, and a double-sided tape adhered to the other surface of the shielding layer, and
   wherein the magnetic field shielding sub-sheet is formed of a band shape having a certain width and is attached to a periphery of the magnetic field shielding main sheet while having the same structure as that of the magnetic field shielding main sheet.

2. The magnetic field shielding sheet of claim 1, wherein some parts of the adhesive layer included in the cover layer and the double-sided tape are filled in gaps between the plurality of pieces.

3. The magnetic field shielding sheet of claim 1, wherein the amorphous alloy is a Fe-based amorphous alloy or a Co-based amorphous alloy.

4. The magnetic field shielding sheet of claim 1, wherein thickness of the shielding layer is set to a range of 15~35 μm, and size of the pieces is set to a range of several tens μm~3 mm range.

5. The magnetic field shielding sheet of claim 1, further comprising a heat dissipation sheet that is attached on the magnetic field shielding main sheet to dissipate heat generated from components incorporated in the portable terminal device.

6. A portable terminal device comprising:
   a case;
   a display panel disposed in front of the case;
   a digitizer panel disposed on a rear surface of the display panel;
   a magnetic field shielding sheet disposed on a rear surface of the digitizer panel;
   a magnesium frame mounted inside the case and to which various parts and panels are fixed,
   wherein the magnetic field shielding sheet comprises:
   a magnetic field shielding main sheet that is placed one a rear surface of the digitizer panel and prevents affecting the digitizer panel; and
   a magnetic field shielding sub-sheet that is attached on at least one of four side edges of the magnetic field shielding main sheet, and to prevent affecting the digitizer by the magnesium frame,
   wherein the magnetic field shielding main sheet is made of an amorphous alloy or a nanocrystalline alloy, and comprises: a shielding layer made of a plurality of pieces by a flake-treatment process; a cover layer adhered to one surface of the shielding layer; and a double-sided tape adhered to the other surface of the shielding layer, and
   wherein the magnetic field shielding sub-sheet is formed of a band shape having a certain width and is attached to a periphery of the magnetic field shielding main sheet while having the same structure as that of the magnetic field shielding main sheet.

7. The portable terminal device of claim 6, wherein some parts of the adhesive layer included in the cover layer and the double-sided tape are filled in gaps between the plurality of pieces.

8. The portable terminal device of claim 6, further comprising a heat dissipation sheet that is attached on the magnetic field shielding main sheet to dissipate heat generated from components incorporated in the portable terminal device.

9. The portable terminal device of claim 6, wherein the magnetic field shielding sub-sheet is provided on a side surface to which the digitizer panel is fixed by the magnesium frame.

* * * * *